United States Patent [19]
Sim

[11] Patent Number: 6,125,460
[45] Date of Patent: Sep. 26, 2000

[54] METHOD FOR TESTING SEMICONDUCTOR DEVICE HAVING EMBEDDED NONVOLATILE MEMORY

[75] Inventor: Gyoo-chan Sim, Kyungki-do, Rep. of Korea

[73] Assignee: Samsung Electronics Co., Ltd., Rep. of Korea

[21] Appl. No.: 09/168,633

[22] Filed: Oct. 8, 1998

[30] Foreign Application Priority Data

Oct. 8, 1997 [KR] Rep. of Korea ..................... 97-51665

[51] Int. Cl.⁷ .................................................. G11C 29/00
[52] U.S. Cl. ........................................................... 714/718
[58] Field of Search ...................................... 714/718, 720

[56] References Cited

U.S. PATENT DOCUMENTS

5,357,519 10/1994 Martin et al. ............................. 714/25
6,032,281 2/2000 Fujisaki ................................... 714/738

Primary Examiner—Phung M. Chung
Attorney, Agent, or Firm—Myers Bigel Sibley & Sajovec

[57] ABSTRACT

A method for testing a semiconductor device having a logic, a nonvolatile memory and a code generator for generating a code in response to the output of the nonvolatile memory is provided. The method includes the steps of loading a program, generating a code, inputting the code, testing the nonvolatile memory, comparing, checking the test response, revising the test program, and testing the semiconductor device. Specifically, the test program is loaded on the tester. Then a code is generated from memory data stored in the nonvolatile memory, and the code is input into the tester. The nonvolatile memory of the semiconductor device is tested, and the test response output from the code generator is stored in a predetermined memory of the tester. The test response is compared with the code, and the code is replaced by the test response if the test response and the code are the same with each other. Then, the test responses for obtaining the test response having a high level of precision is checked by comparing the test response with each other several times. The test program is revised by incorporating the test response into the test program. The semiconductor device is tested using the revised test program.

16 Claims, 7 Drawing Sheets

METHOD FOR TESTING SEMICONDUCTOR DEVICE HAVING EMBEDDED NONVOLATILE MEMORY

BACKGROUND OF THE INVENTION

1. Field of the Invention

The present invention relates to a testing method of a semiconductor device, and more particularly, to a testing method of a semiconductor device having an embedded nonvolatile memory.

2. Description of the Related Art

A semiconductor device includes various circuits according to uses. The circuits are generally composed of a nonvolatile memory for storing data and a logic circuit having a control function. A tester is used for testing the functions of the semiconductor device. To test the semiconductor device, a test program including a test pattern and a test response is loaded by a user. Then, the semiconductor device is electrically connected to the tester, and the tester having the loaded test program is operated to perform the test for the functions of the semiconductor device. As a result, if the semiconductor device falls under the function requirements, the semiconductor device is considered to have passed the test. If the semiconductor device does not fall under the function requirements, the semiconductor is considered to have failed in the test.

Among a nonvolatile memory included in a semiconductor device, a read only memory (ROM) retains data even if the power is interrupted, once it is masked. Among ROMs, there is an ROM which cannot change data stored therein, which is called a programmable ROM. To test a semiconductor device having an embedded programmable ROM, whenever memory data stored in the programmable ROM, e.g., ROM codes, is changed, the test program must be changed to be loaded in the tester. In the case of testing a semiconductor device having a logic and programmable ROM, the test response for the logic is unchangeable and that for the programmable ROM is changeable according to changing memory data.

Conventionally, whenever the memory data changes, the test program must be generated again. However, in the case of generating the test program whenever the memory data changes, much time is required, which increases the manufacturing cost of the semiconductor device and thus lowers the productivity.

SUMMARY OF THE INVENTION

To solve the above problems, it is an object of the present invention to provide a method for testing a semiconductor device having an embedded nonvolatile memory, by which the semiconductor device is tested by changing only the test response for memory data, without generating the test program again when the memory data changes.

In method for testing a semiconductor device having an embedded nonvolatile memory using a tester, for achieving the above object of the present invention, a test program is loaded on the tester, and memory data stored in the nonvolatile memory is input into the tester. A test response is generated by compiling the memory data. Then, the test program is revised by incorporating the test response into the test program, and the semiconductor device is tested using the revised test program.

According to another feature of the present invention, there is provided a method for testing a semiconductor device having an embedded nonvolatile memory using a tester, comprising the steps of loading a test program on the tester and generating a first code from memory data stored in the nonvolatile memory. Then, the first code is input into the tester and a nonvolatile memory of the semiconductor device is tested. A second code is generated from the test response generated in the step of testing the nonvolatile memory, and the second code is input into a predetermined memory of the tester. The second code is compared with the first code, and the first code is replaced by the test response if the first and second codes are the same with each other. Then, the test responses are compared for obtaining the test response having a high level of precision by comparing the test response with each other several times. The test program is revised by incorporating the test response into the test program, and the semiconductor device is tested using the revised test program.

Also, there is provided a method for testing a semiconductor device having a logic, a nonvolatile memory and a code generator for generating a code in response to the output of the nonvolatile memory, using a tester, comprising the steps of loading a test program on the tester and inputting the code output from the code generator into the tester. Then, a test response is generated by compiling the code input to the tester, and the test program is revised by incorporating the test response into the test program. The semiconductor device is tested using the revised test program.

There is further provided a method for testing a semiconductor device having a logic, a nonvolatile memory and a code generator for generating a code in response to the output of the nonvolatile memory is provided. The method includes the steps of loading a program, generating a code, inputting the code, testing the nonvolatile memory, comparing, checking the test response, revising the test program, and testing the semiconductor device. Specifically, the test program is loaded on the tester. Then a code is generated from memory data stored in the nonvolatile memory, and the code is input into the tester. The nonvolatile memory of the semiconductor device is tested, and the test response output from the code generator is stored in a predetermined memory of the tester. The test response is compared with the code, and the code is replaced by the test response if the test response and the code are the same with each other. Then, the test responses for obtaining the test response having a high level of precision is checked by comparing the test response with each other several times. The test program is revised by incorporating the test response into the test program. The semiconductor device is tested using the revised test program.

As described above, according to the present invention, the manufacturing cost of the semiconductor device is reduced and the productivity is enhanced.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT(S)

Hereinbelow, preferred embodiments of the present invention will be described in detail with reference to accompanying drawings.

Figure 1:
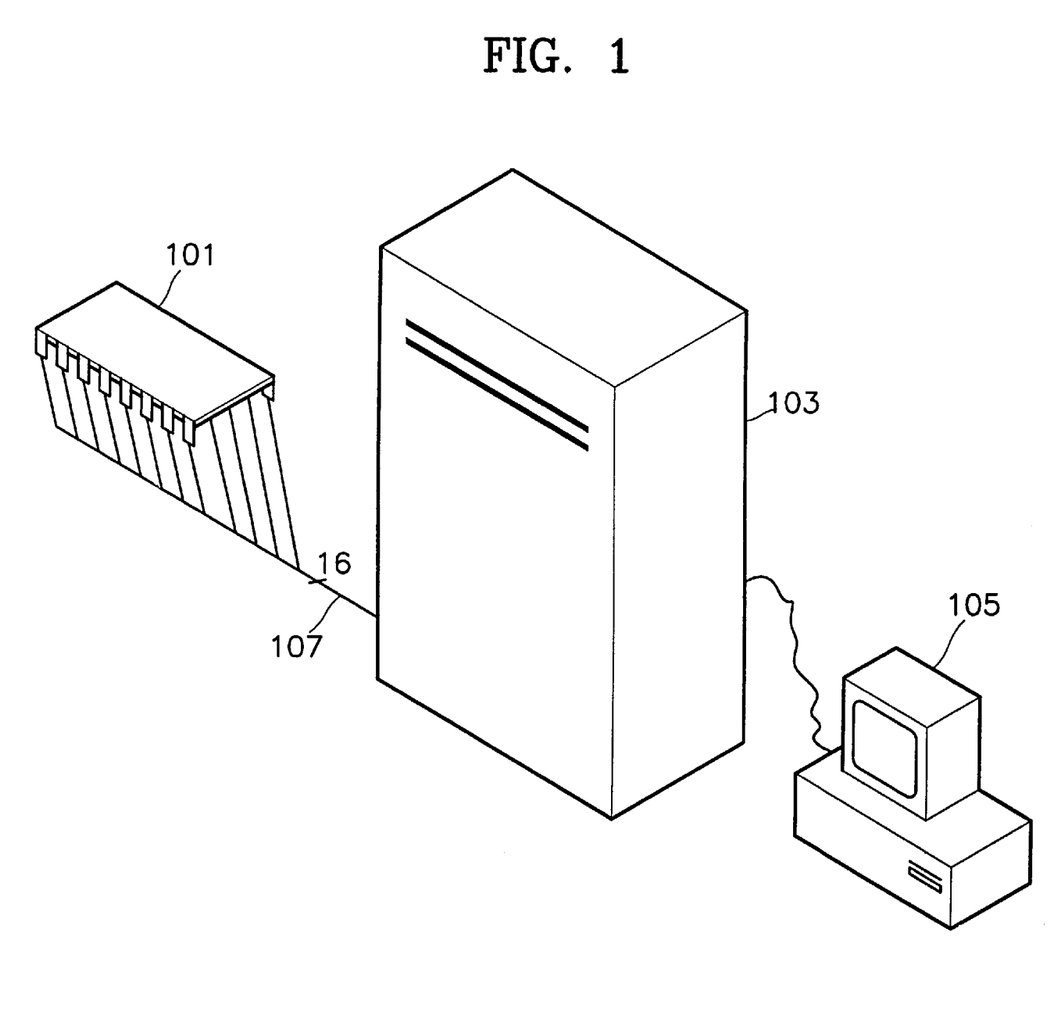
FIG. 1 is a schematic perspective view of a tester and a semiconductor device, for explaining a method for testing a semiconductor device having an embedded nonvolatile memory according to the present invention.

Referring to FIG. 1, in testing a semiconductor device 101 using a tester 103, the semiconductor device 101 and the tester 103 are connected through a wire 107. A test program for testing the semiconductor device 101 is loaded into the tester 103. The tester 103 is controlled by a terminal 105. The test program includes many parameters for measuring the functions of the semiconductor device 101 from various aspects. If the semiconductor device 101 satisfies all of the parameters, the semiconductor device 101 is determined to be good. Otherwise, if the semiconductor device 101 does not satisfy all of the parameters, the semiconductor device 101 is determined as a failure.

Figure 2A:
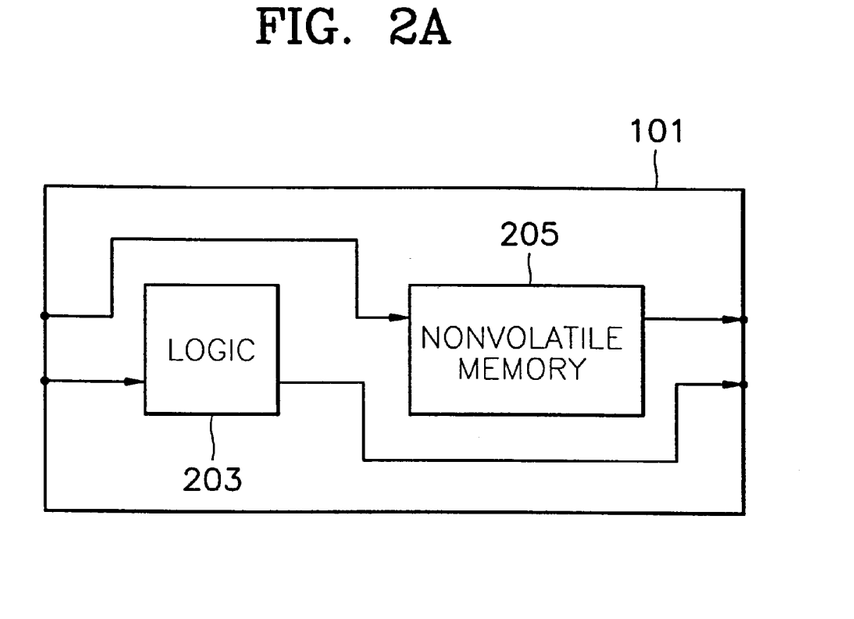
FIGS. 2A and 2B are block diagrams of the semiconductor device shown in FIG. 1.

FIG. 2A is a block diagram of the semiconductor device 101 shown in FIG. 1. Referring to FIG. 2A, the semiconductor device 101 includes a logic 203 and a nonvolatile memory 205. In the semiconductor device 101 to which the semiconductor device testing method according to the present invention is applied, is during a test mode, a signal applied to the logic 203 is immediately output to the exterior of the device, and a signal applied to the nonvolatile memory 205 is immediately output to the exterior of the device.

Figure 2B:
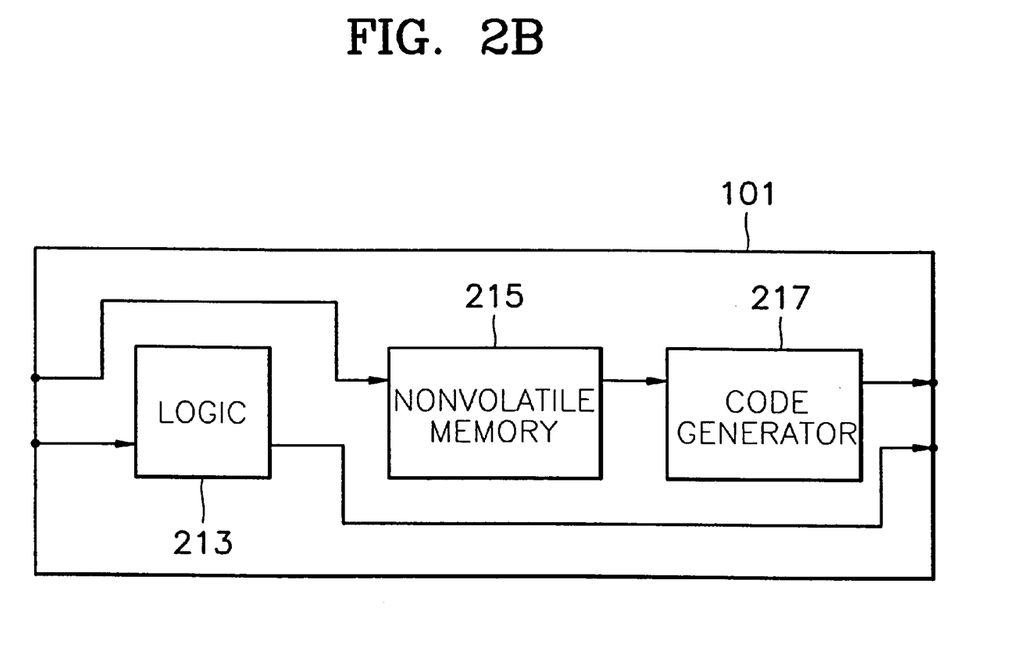

FIG. 2B is another block diagram of the semiconductor device 101 shown in FIG. 1. Referring to FIG. 2B, the semiconductor device 101 includes a logic 213, a nonvolatile memory 215 and a code generator 217. In the semiconductor device 101 to which the semiconductor device testing method according to the present invention is applied, a signal applied to the logic 213 is immediately output to the exterior of the device, and a signal applied to the nonvolatile memory 215 is output to the exterior of the device via the code generator 217.

Figure 3:
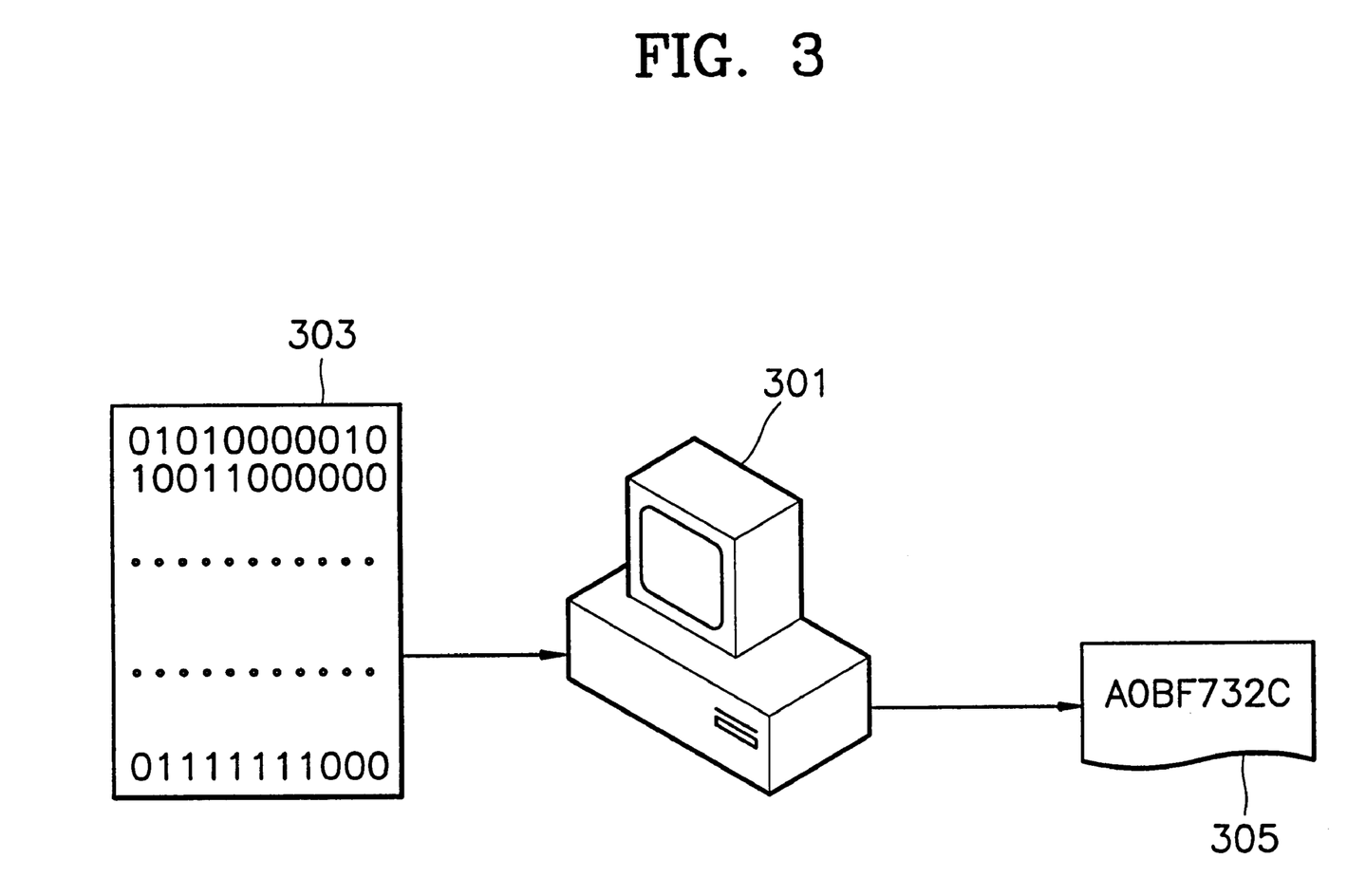
FIG. 3 illustrates a code generating method included in the method for testing a semiconductor device having an embedded nonvolatile memory according to the present invention.

FIG. 3 illustrates a code generating method included in the method for testing a semiconductor device having an embedded nonvolatile memory according to the present invention. Referring to FIG. 3, to generate a code 305, a code generator 301, e.g., a computer, is necessary. The code generator 301 includes a software for generating the code 305, e.g., a multiple input signature register. To generate the code 305, memory data 303, e.g., an ROM code file, is input to the code generator 301. If the memory data 303 is input to the code generator 301, the code generator 301 generates the code 305. The code 305 is obtained by compressing the memory data 303 and the content thereof is shorter than that of the memory data 303. Thus, if the nonvolatile memories 205 and 215 of the semiconductor device 101 are tested using the code 305, the testing time is greatly reduced.

Figure 4:
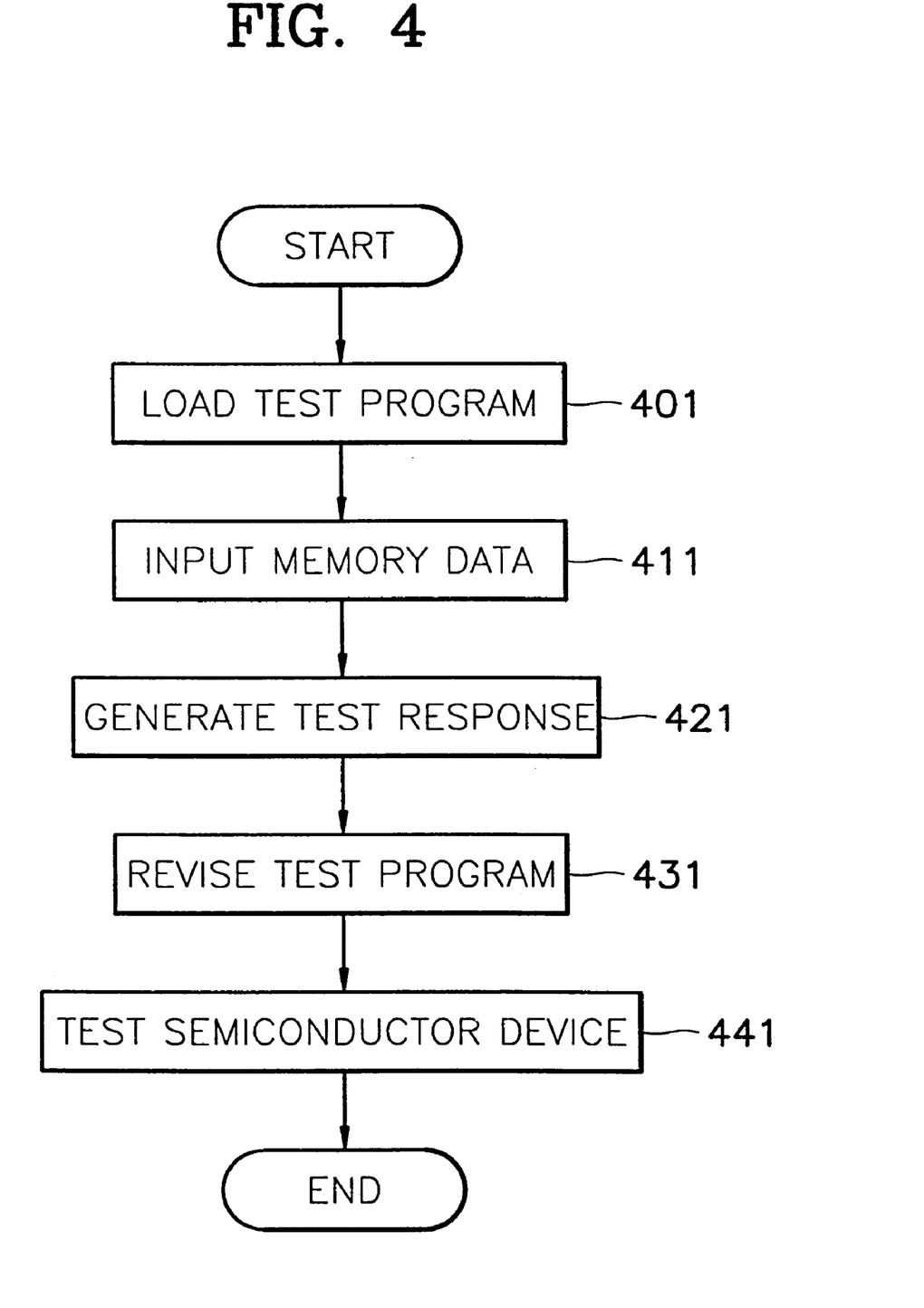
FIG. 4 is a flow chart showing a method for testing a semiconductor device having an embedded nonvolatile memory according to a first embodiment of the present invention.

FIG. 4 is a flow chart showing a method for testing a semiconductor device having an embedded nonvolatile memory according to a first embodiment of the present invention, which will be described with reference to FIGS. 1 through 2A.

The semiconductor device 101 having an embedded nonvolatile memory to which the testing method according to a first embodiment of the present invention is applied includes a logic 203 and a nonvolatile memory 205. The nonvolatile memory 205 is a read only memory (ROM), specifically a programmable ROM which can change the storage content thereof. The semiconductor device testing method according to a first embodiment of the present invention includes the steps of loading a test program (step 401), inputting memory data (step 411), generating a test response (step 421), revising the test program (step 431) and testing the semiconductor device (step 441).

In step 401, a test program for testing the semiconductor device 101 is loaded to the tester 103. Various testers are used as the tester 103 for testing the semiconductor device 101. Also, there are various kinds of software used for the tester 103. Therefore, a user selectively uses the tester 103 and software suitable to characteristics of the semiconductor device 101. The tester 103 uses a test program pre-stored in its own specific memory or receives the test program from a data storage unit, e.g., a disk.

In step 411, the memory data 303 which is the same as the memory data stored in the nonvolatile memory 205 is input to the tester 103. The tester 103 uses the memory data 303 pre-stored in its own specific memory or receives the test program from a data storage unit, e.g., a disk.

In step 421, the memory data 303 is compiled into machine language which can be recognized by the tester 103. In other words, the test response for the nonvolatile memory 205 is generated.

In step 431, the test response is incorporated into the test program. By doing so, the test program is revised. The test response for the logic 203 of the semiconductor device and that for the nonvolatile memory 205 are incorporated into one in the test program.

In step 441, the tester 103 performs the test on the logic 203 and nonvolatile memory 205 of the semiconductor device by the revised test program. Either of the logic 203 and the nonvolatile memory 205 is abnormal, the semiconductor device 101 is regarded as a failure.

Figure 5:
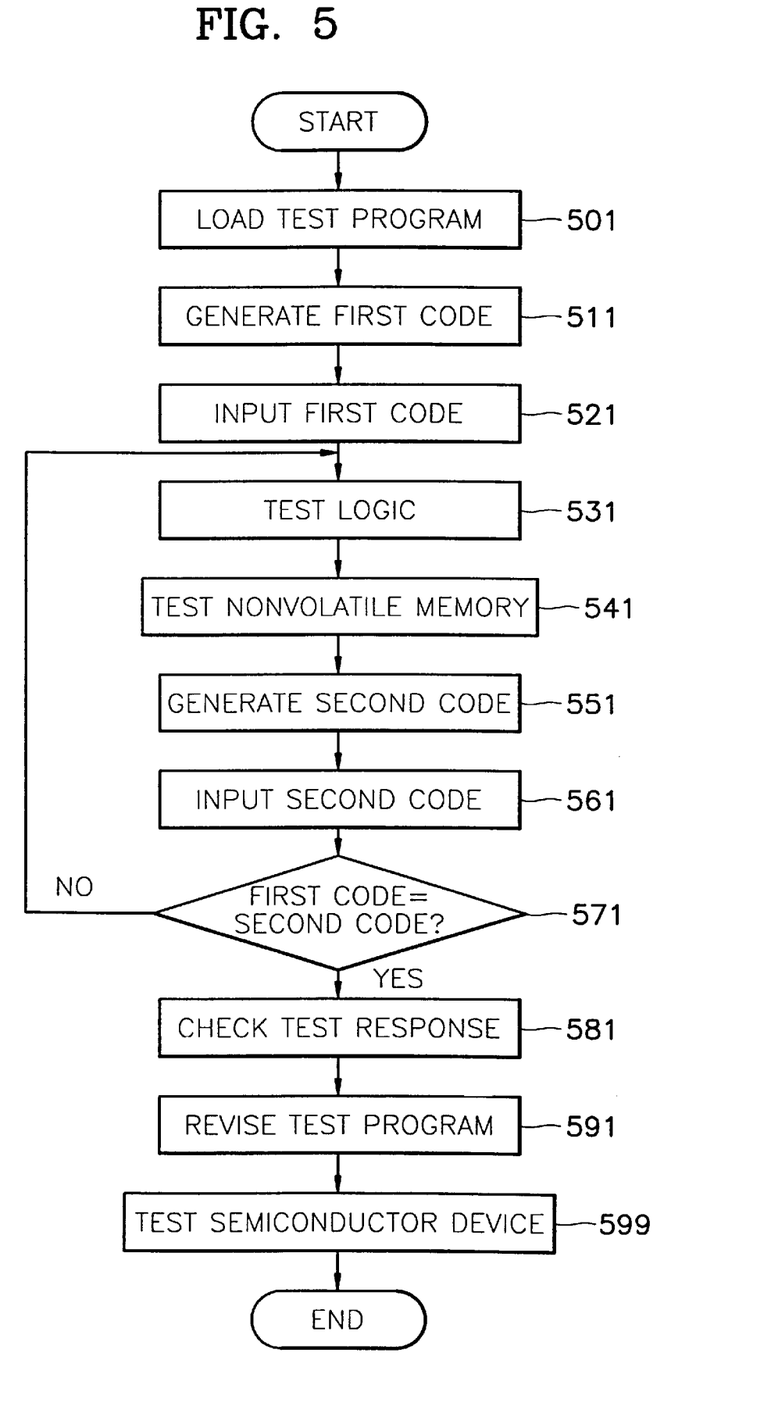
FIG. 5 is a flow chart showing a method for testing a semiconductor device having an embedded nonvolatile memory according to a second embodiment of the present invention.

FIG. 5 is a flow chart showing a method for testing a semiconductor device having an embedded nonvolatile memory according to a second embodiment of the present invention, which will be described with reference to FIGS. 1, 2A and 3.

The semiconductor device 101 to which the method for testing a semiconductor device having an embedded nonvolatile memory according to a second embodiment of the present invention is applied includes a logic 203 and a nonvolatile memory 205. The nonvolatile memory 205 is a read only memory (ROM), specifically a programmable ROM which can change the storage content thereof. The semiconductor device testing method according to a second embodiment of the present invention includes the steps of loading a test program (step 501), generating a first code (step 511), inputting the first code (step 521), testing a logic (step 531), testing a nonvolatile memory (step 541), generating a second code (step 551), inputting the second code (step 561), comparing (571), checking the test response (step 581), revising the test program (step 591) and testing the semiconductor device (step 599).

In step 501, a test program for testing the semiconductor device 101 is loaded to the tester 103. Various testers are used as the tester 103 for testing the semiconductor device 101. Also, there are various kinds of software used for the tester 103. Therefore, a user selectively uses the tester 103 and software suitable to characteristics of the semiconductor device 101.

In step 511, the first code is generated from the memory data 303 stored in the nonvolatile memory 205 is input to the tester 103. To generate the first code, the memory data 303 which is the same as the memory data stored in the nonvolatile memory 205 is input to the tester 103. The code generator 301 generates the first code from the input data using a software stored in itself. The first code is very simple, compared to the memory data 303 stored in the nonvolatile memory 205.

In step 521, the first code is input to the tester 103. The first code is directly transmitted to the tester 103 or input to the tester 103 via a data storage unit, e.g., a disk.

In step 531, the semiconductor device 101 is electrically connected to the tester 103 and the logic 203 thereof is tested. If the semiconductor device 101 fails in the test, another semiconductor device is connected to the tester 103 to then be tested. If another semiconductor device passes the test, the test operation is stopped. If the semiconductor device fails in the test, still another semiconductor device is connected to the tester 103 to be subjected to the same test. Until a tested semiconductor device passes, the logic testing step (step 531) is repeatedly performed.

In step 541, the nonvolatile memory 205 of the semiconductor device 101 is tested by the tester 103. If the test is completed, the tester 103 receives the test response from the semiconductor device 101 and stores the same in its own specific memory.

In step 551, the second code is generated from the test response generated in step 541. The test response is input to the code generator 301, and the code generator 301 generates the second code using the test response.

In step 561, the second code generated by the code generator 301 is input to a predetermined memory of the tester 103. The tester 103 has several memories, to one of which the second code is input. The second code is directly transmitted from the code generator 301 to the tester 103 or input to the tester 103 via a data storage unit, e.g., a disk.

In step 571, the second code is compared with the first code. Since the contents of the first and second codes are relatively simple, the comparison time is very short. If the first and second codes are the same with each other, the step proceeds to the step 581 of checking the test response. If not, the step returns to the step 531 of testing the logic.

In step 581, to compare the test response which is the result of the step 571 with the test response obtained by performing the steps 531 through 571 on another semiconductor device, it is checked whether these test responses are the same with each other. To enhance the reliability and precision of the test response, this step may be repeatedly performed until the same test responses are checked at least a predetermined number of times, e.g., at least five or more times.

In step 591, the test response is incorporated into the test program. In other words, the test program is revised, thereby completing the test program for the semiconductor device having an embedded nonvolatile memory whose test response is incorporated with that for the logic 203.

In step 599, the tester 103 performs the test on the semiconductor device 101 using the revised test program. Either of the logic 203 and the nonvolatile memory 205 is abnormal, the semiconductor device 101 is regarded as a failure to fall into disuse.

As described above, the test program is revised using the code 305, instead of the memory data 303. Thus, the revising time of the test program is shortened.

Figure 6:
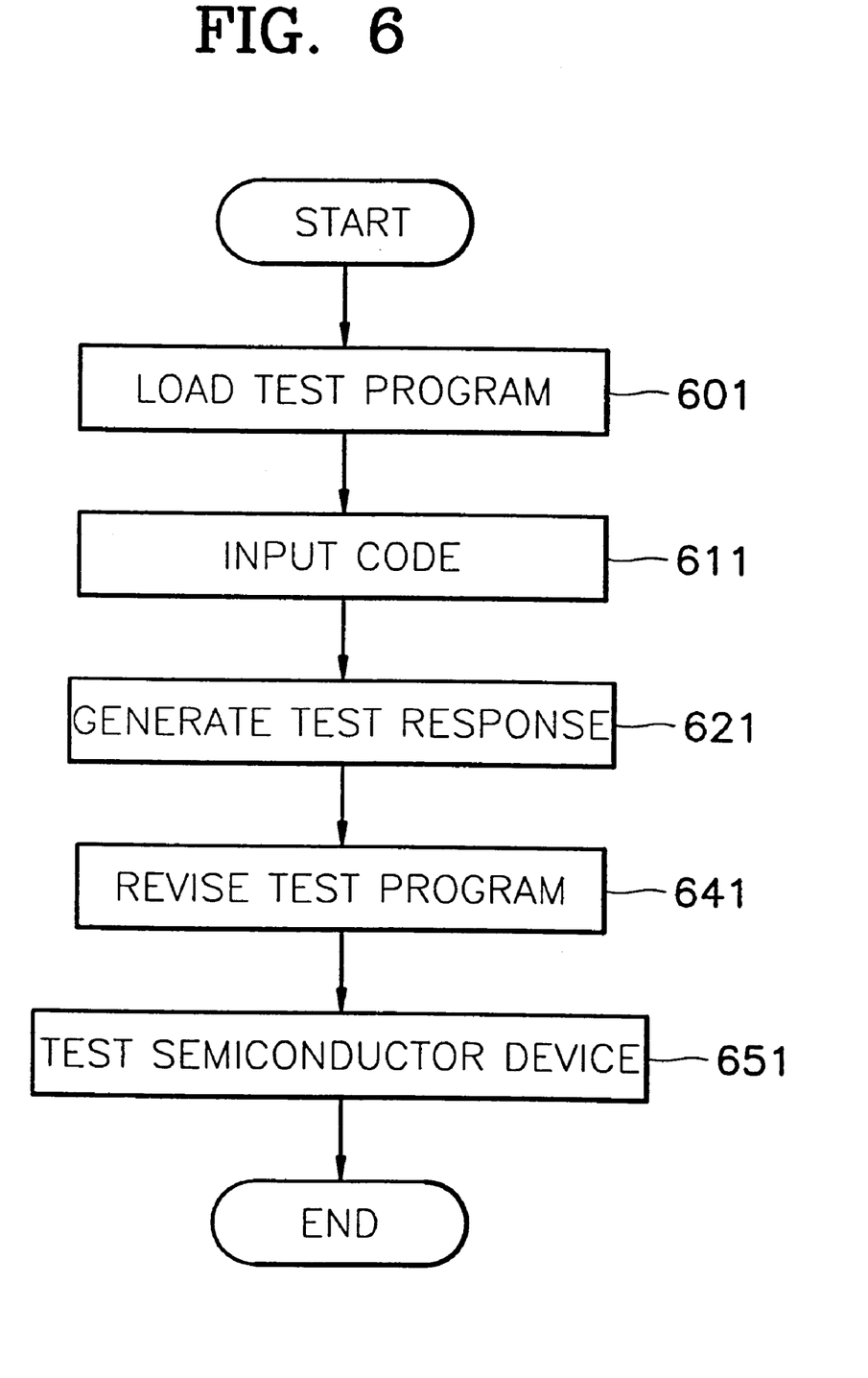
FIG. 6 is a flow chart showing a method for testing a semiconductor device having an embedded nonvolatile memory according to a third embodiment of the present invention.

FIG. 6 is a flow chart showing a method for testing a semiconductor device having an embedded nonvolatile memory according to a third embodiment of the present invention, which will be described with reference to FIGS. 1 and 2B.

The semiconductor device 101 having an embedded nonvolatile memory to which the testing method according to a third embodiment of the present invention is applied includes a logic 213, a nonvolatile memory 215 and a code generator 217. The nonvolatile memory 215 is a read only memory (ROM), specifically a programmable ROM which can change the storage content thereof. The semiconductor device testing method according to a third embodiment of the present invention includes the steps of loading a test program (step 601), inputting a code (step 611), generating a test response (step 621), revising the test program (step 641) and testing the semiconductor device (step 651).

In step 601, a test program for testing the semiconductor device 101 is loaded to the tester 103. Various testers are used as the tester 103 for testing the semiconductor device 101. Also, there are various kinds of software used for the tester 103. Therefore, a user selectively uses the tester 103 and software suitable to characteristics of the semiconductor device 101. The tester 103 uses a test program pre-stored in its own specific memory or receives the test program from a data storage unit, e.g., a disk.

In step 611, the code 305 for the memory data 303 stored in the nonvolatile memory 215 is input to the tester 103. The tester 103 uses the code 305 pre-stored in its own specific memory or receives the code 305 from a data storage unit, e.g., a disk.

In step 621, the code 303 is compiled into machine language which can be recognized by the tester 103. In other words, the test response for the nonvolatile memory 215 is generated.

In step 641, the test response is incorporated into the test program. By doing so, the test program is revised. in the test program, the test response for the logic 213 of the semiconductor device and that for the nonvolatile memory 215 are incorporated into one in the test program.

In step 651, the tester 103 performs the test on the logic 213 and nonvolatile memory 215 of the semiconductor device by using the revised test program. Either of the logic 213 and the nonvolatile memory 215 is abnormal, the semiconductor device 101 is regarded as a failure to fall into disuse.

As described above, the revising time of the test program is shortened by revising the test program using the code 305, instead of the memory data 303.

Figure 7:
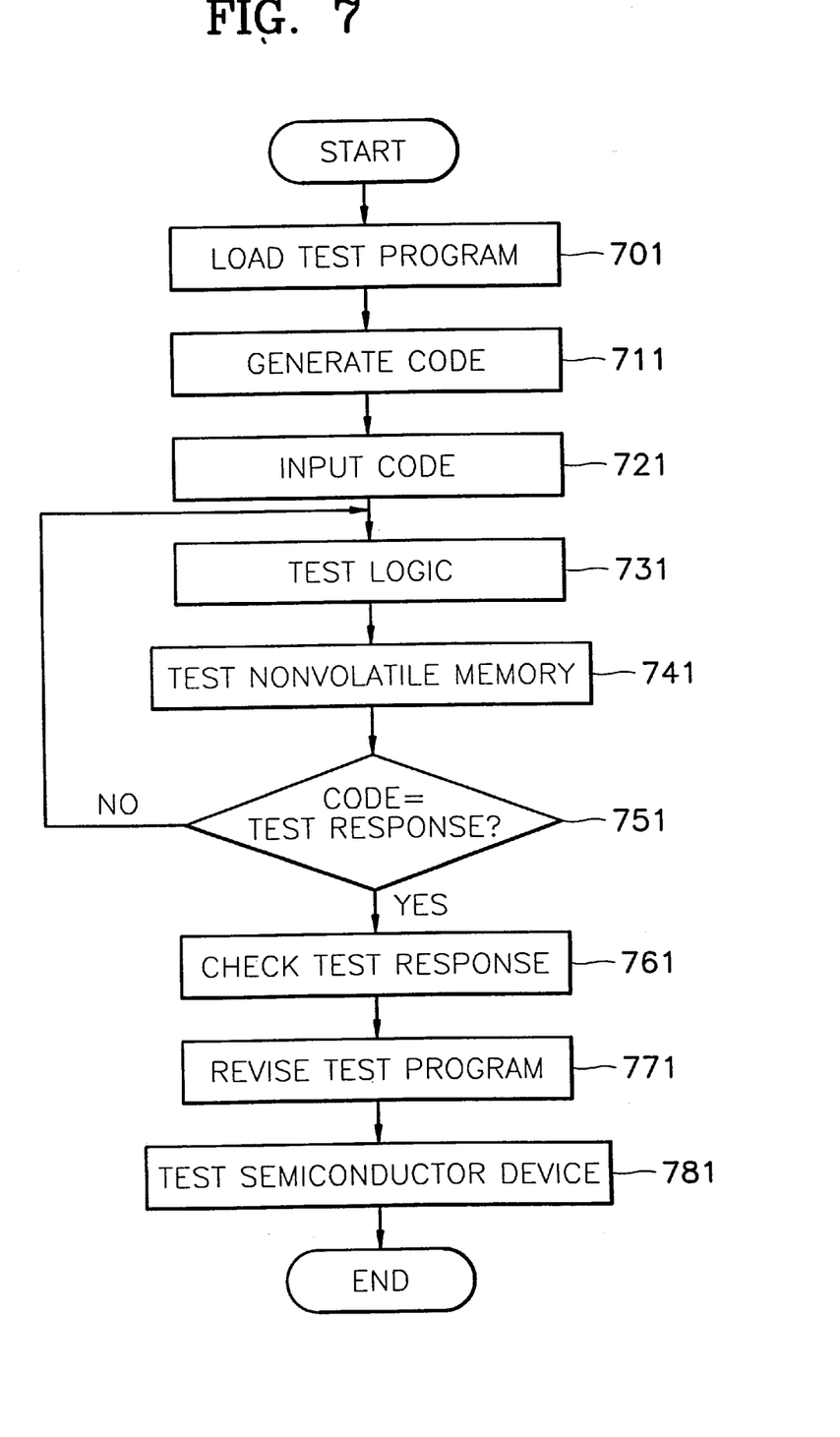
FIG. 7 is a flow chart showing a method for testing a semiconductor device having an embedded nonvolatile memory according to a fourth embodiment of the present invention.

FIG. 7 is a flow chart showing a method for testing a semiconductor device having an embedded nonvolatile memory according to a fourth embodiment of the present invention, which will be described with reference to FIGS. 1, 2B and 3.

The semiconductor device having an embedded nonvolatile memory to which the testing method according to a fourth embodiment of the present invention is applied includes a logic 213, a nonvolatile memory 215 and a code generator 217. The nonvolatile memory 215 is a read only memory (ROM), specifically a programmable ROM which can change the storage content thereof. The semiconductor device testing method according to a fourth embodiment of the present invention includes the steps of loading a test program (step 701), generating a code (step 711), inputting the code (step 721), testing a logic (step 731), testing a nonvolatile memory (step 741), comparing (step 751), checking a test response (761), revising the test program (step 771) and testing the semiconductor device (781).

In step 701, a test program for testing the semiconductor device 101 is loaded to the tester 103. Various testers are used as the tester 103 for testing the semiconductor device 101. Also, there are various kinds of software used for the tester 103. Therefore, a user selectively uses the tester 103 and software suitable to characteristics of the semiconductor device 101.

In step 711, the code 305 is generated from the data which is the same as the memory data 303 stored in the nonvolatile memory 215. To generate the code 305, the data which is the same as the memory data 303 stored in the nonvolatile memory 215 is input to the code generator 301. The code generator 301 generates the code 305 from the input data using a software stored in itself. The code 305 is very simple, compared to the memory data 303 stored in the nonvolatile memory 215.

In step 721, the code 305 is input to the tester 103. The code 305 is directly transmitted from the code generator 301 to the tester 103 or input to the tester 103 via a data storage unit, e.g., a disk.

In step 731, after the semiconductor device 101 is electrically connected to the tester 103 and the logic 213 thereof is tested. If the semiconductor device 101 fails in the test, another semiconductor device is connected to the tester 103 to then be tested. If another semiconductor device passes the test, the test operation is stopped. If the semiconductor device fails in the test, still another semiconductor device is connected to the tester 103 to be subjected to the same test. Until a tested semiconductor device passes, the logic testing step (step 731) is repeatedly performed.

In step 741, the nonvolatile memory 215 of the semiconductor device 101 is tested by the tester 103. If the test is completed, the tester 103 receives the test response from the semiconductor device 101 and stores the same in its own specific memory. The test response is composed of the code 305. The tester 103 has several memories, in one of which the test response is stored.

In step 751, the test response is compared with the code 305. Since the contents of the code 305 and the test response are relatively simple, the comparison time is very short. If the code 305 and the test response are the same with each other, the code 305 is used, instead of the test response. If not, the procedure returns to the step 731 of testing the logic.

In step 761, to compare the test response which is the result of the step 751 with the test response obtained by performing the steps 731 through 751 on another semiconductor device, it is checked whether these test responses are the same with each other. To enhance the reliability and precision of the test response, this step may be repeatedly performed until the same test responses are checked at least a predetermined number of times, e.g., at least five or more times.

In step 771, the code 305 is incorporated into the test program. In other words, the test program is revised, thereby completing the test program for the semiconductor device 101 having an embedded nonvolatile memory whose test response is incorporated into that for the logic 213.

In step 781, the tester 103 performs the test on the semiconductor device 101 using the revised test program. Either of the logic 213 and the nonvolatile memory 215 is abnormal, the semiconductor device 101 is regarded as a failure to fall into disuse.

As described above, the revising time of the test program is shortened by revising the test program using the code 305, instead of the memory data 303.

Accordingly, the manufacturing cost of the semiconductor device having an embedded nonvolatile memory is reduced to thus improve the productivity. Also, by using a code, it is facilitated to manage the test program for semiconductor devices having different memory data while belonging to the same semiconductor product group.

The present invention is not limited to those embodiments having been described above and it is evident that many modifications and changes may be effected by one skilled in the art within the scope of the invention.

What is claimed is:

1. A method for testing a semiconductor device having an embedded nonvolatile memory using a tester, comprising the steps of:
   loading a test program on the tester;
   inputting memory data stored in the nonvolatile memory into the tester;
   generating a test response by compiling the memory data;
   revising the test program by incorporating the test response into the test program; and
   testing the semiconductor device using the revised test program.

2. The method according to claim 1, wherein a read only memory (ROM) is used as the nonvolatile memory.

3. The method according to claim 2, wherein the ROM is a programmable ROM.

4. A method for testing a semiconductor device having an embedded nonvolatile memory using a tester, comprising the steps of:
   loading a test program on the tester;
   generating a first code from memory data stored in the nonvolatile memory;
   inputting the first code into the tester;
   testing a nonvolatile memory of the semiconductor device;
   generating a second code from the test response generated in the step of testing the nonvolatile memory;
   inputting the second code into a predetermined memory of the tester;
   comparing the second code with the first code, and replacing the first code by the test response if the first and second codes are the same with each other;
   checking the test responses for obtaining the test response having a high level of precision by comparing the test response with each other several times;
   revising the test program by incorporating the test response into the test program; and
   testing the semiconductor device using the revised test program.

5. The method according to claim 4, before the step of testing the nonvolatile memory, further comprising the step of:
   electrically connecting the semiconductor device into the tester to test a logic of the semiconductor device until the logic passes the test.

6. The method according to claim 4, wherein a read only memory (ROM) is used as the nonvolatile memory.

7. The method according to claim 6, wherein the ROM is a programmable ROM.

8. The method according to claim 6, wherein, in the comparing step, the procedure returns to the step of testing the nonvolatile memory if the test response and the code are not the same with each other.

9. A method for testing a semiconductor device having a logic, a nonvolatile memory and a code generator for generating a code in response to the output of the nonvolatile memory, using a tester, comprising the steps of:

loading a test program on the tester;

inputting the code output from the code generator into the tester;

generating a test response by compiling the code input to the tester;

revising the test program by incorporating the test response into the test program; and testing the semiconductor device using the revised test program.

10. The method according to claim 9, wherein a read only memory (ROM) is used as the nonvolatile memory.

11. The method according to claim 10, wherein the ROM is a programmable ROM.

12. A method for testing a semiconductor device having a logic, a nonvolatile memory and a code generator for generating a code in response to the output of the nonvolatile memory, using a tester, comprising the steps of:

loading a test program on the tester;

generating a code from memory data stored in the nonvolatile memory;

inputting the code into the tester;

testing a nonvolatile memory of the semiconductor device, and storing the test response output from the code generator in a predetermined memory of the tester;

comparing the test response with the code, and replacing the code by the test response if the test response and the code are the same with each other;

checking the test responses for obtaining the test response having a high level of precision by comparing the test response with each other several times;

revising the test program by incorporating the test response into the test program; and testing the semiconductor device using the revised test program.

13. The method according to claim 12, before the step of testing the nonvolatile memory, further comprising the step of:

electrically connecting the semiconductor device into the tester to test a logic of the semiconductor device until the logic passes the test.

14. The method according to claim 12, wherein a read only memory (ROM) is used as the nonvolatile memory.

15. The method according to claim 14, wherein the ROM is a programmable ROM.

16. The method according to claim 12, wherein, in the comparing step, the procedure returns to the step of testing the nonvolatile memory if the test response and the code are not the same with each other.

* * * * *